United States Patent [19]
Asai

[11] Patent Number: 6,048,259
[45] Date of Patent: Apr. 11, 2000

[54] WAFER LOADING AND UNLOADING MECHANISM FOR LOADING ROBOT

[75] Inventor: Toru Asai, Ayase, Japan

[73] Assignee: Speedfam Company, Limited, Ayase, Japan

[21] Appl. No.: 09/228,761

[22] Filed: Jan. 12, 1999

[30] Foreign Application Priority Data

Jan. 19, 1998 [JP] Japan ................................ 10-007356

[51] Int. Cl.$^7$ .................................................. B24B 47/02
[52] U.S. Cl. ........................................... 451/339; 451/332
[58] Field of Search ..................................... 451/331, 332, 451/333, 337, 339, 41, 285, 286, 287, 288, 289

[56] References Cited

U.S. PATENT DOCUMENTS

| | | | |
|---|---|---|---|
| 1,722,589 | 7/1929 | Miller, Jr. ............................ | 451/337 |
| 2,602,275 | 7/1952 | Maly ................................... | 451/137 |
| 5,865,670 | 2/1999 | Frank et al. ........................ | 451/339 |
| 5,893,794 | 2/1997 | Togawa et al. ..................... | 451/339 |

*Primary Examiner*—Rodney Butler
*Attorney, Agent, or Firm*—Oliff & Berridge PLC

[57] ABSTRACT

A wafer loading and unloading mechanism is arranged in such a way that polished wafers stored in the loading cassette in a loading robot are not subject to dust contamination. The mechanism for moving loading cassettes mounted in a loading robot upward and downward is provided under the loading cassettes in order to prevent polished wafers from being contaminated with dust which may be generated or become airborne when driving force is transmitted.

1 Claim, 2 Drawing Sheets

WAFER LOADING AND UNLOADING MECHANISM FOR LOADING ROBOT

BACKGROUND OF THE INVENTION

1. Field of the Invention

The present invention relates to a wafer loading and unloading mechanism, and more particularly relates to a wafer loading and unloading mechanism which is provided in a loading robot composing an automatic single-wafer single-side polishing machine for picking up wafers inserted in loading cassettes.

2. Description of the Related Art

Generally, an automatic single-wafer single-side polishing machine is constructed in such a way that wafers are stored once in a device called a "loading robot" before being delivered to a buffer unit for polishing.

The loading robot of this type is provided with a pair of storage portions for wafers, called "loading cassettes", in the upper part thereof, and is constructed in such a way that a plurality of unpolished wafers are stored piled in one of a pair of loading cassettes without contacting each other and are delivered successively to a buffer unit by a grabbing means, and then polished wafers are stored successively piled again by a grabbing means in a loading cassette disposed on the other side without contacting each other.

In this arrangement, unpolished wafers stored piled in one of the loading cassettes are to be stored piled in the other loading cassette after being polished.

The loading robot as described above includes two operating members for ensuring a grabbing operation made by a grabbing means, a first operating member moving the loading cassettes upward and downward, and a second operating member swinging the loading cassette in such a way that the rear side of the loading cassette (viewed in the direction of wafer insertion) moves upward with the front side thereof (viewed in the direction of wafer insertion) as a fulcrum in order to place each wafer in the loading cassettes in the same position in plan view.

Generally, since the operating member for moving the loading cassettes upward and downward is so constructed that it transmits driving force from a drive via a belt, the sliding movement of the belt during transmission of driving force inevitably generates fine particles from the belt or causes dust to become airborne, and even worse, the belt is located above the wafers. Therefore, this has a disadvantage in that if the polished wafers are contaminated by fine particles or dust due to the sliding movement of the belt, the wafers will be deemed to be defective, and thus productive efficiency decreases.

SUMMARY OF THE INVENTION

Accordingly, it is an object of the present invention to provide, in an automatic single wafer single side polishing machine, a wafer loading and unloading mechanism for a loading robot with an improved throughput by disposing the driving force transmission mechanism for moving the loading cassettes in the loading robot upward and downward at a level lower than that of the loading cassettes to prevent polished wafers from being contaminated even if fine particles are generated by abrasion of the belt or dust becomes airborne during drive transmission.

In order to overcome the above-mentioned disadvantage, the present invention provides a wafer loading and unloading mechanism mounted in a loading robot which composes an automatic single-wafer single-side polishing machine, and is so constructed that the loading cassettes are moved upward and downward in a swinging manner, the wafer loading and unloading mechanism including a base, a swinging base in which the rear end (viewed in the direction of wafer insertion) is movable upward and downward in a swinging manner with respect to the base with the front end thereof as a fulcrum, having a loading cassette for storing wafers thereon, a first operating member mounted under the base for receiving the driving force from a drive via a belt and moving the base upward and downward during transmission of the driving force, and a second operating member for swinging the swinging base upward when being operated, and the second operating member is so constructed as to be actuated after the completion of insertion of wafers into the loading cassette to place each wafer at the innermost position in the loading cassette.

In the above arrangement, the wafer loading and unloading mechanism for an automatic single wafer single side polishing machine is able to certainly prevent polished wafers from being contaminated with fine particles generated by the abrasion of the belt or the like during sliding movement.

DESCRIPTION OF THE PREFERRED EMBODIMENT

Figure 1:
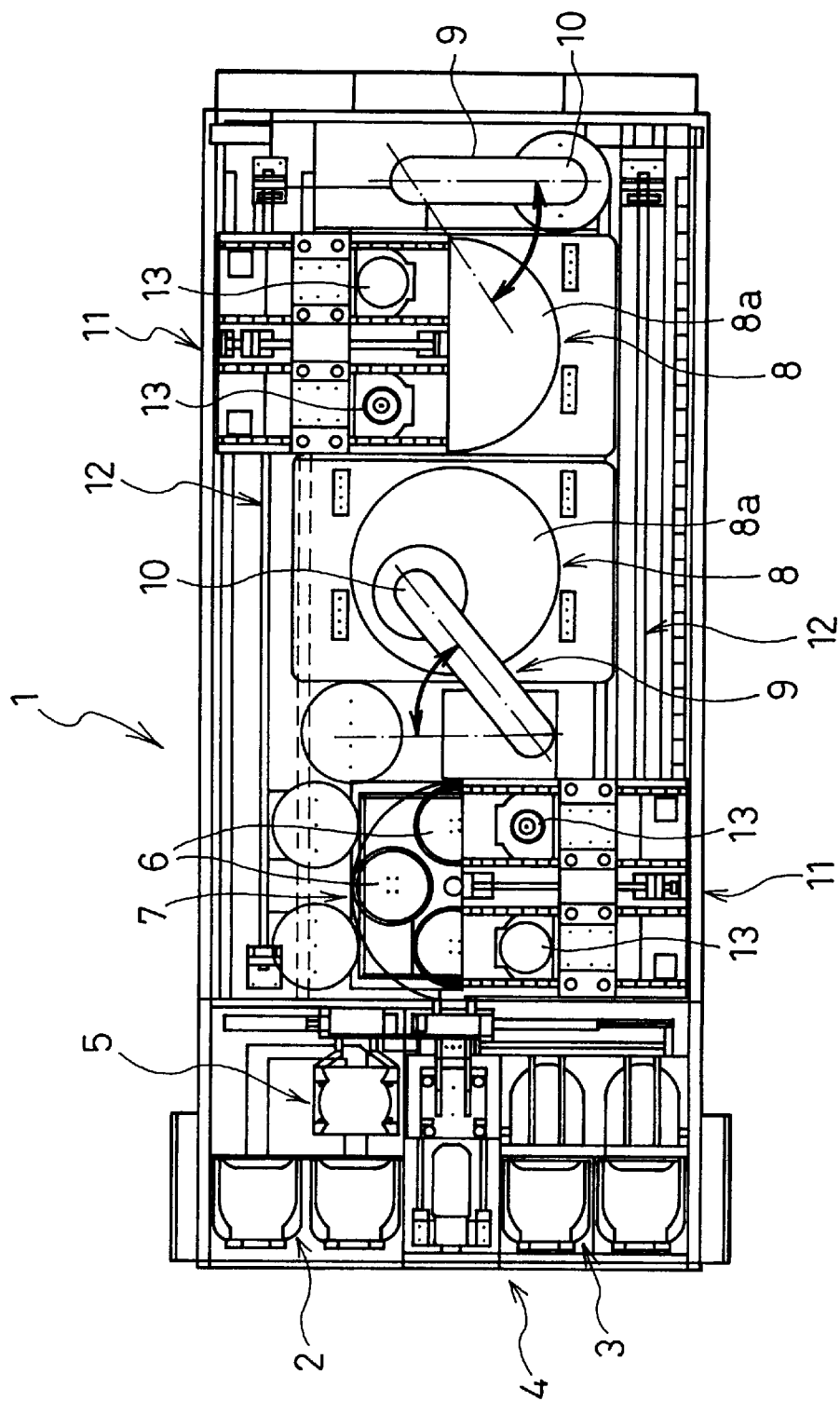
FIG. 1 is a schematic plan view of an automatic single wafer polishing machine according to an embodiment of the present invention.

Referring to the drawings, there is shown a preferred embodiment of the present invention.

Referring now to FIG. 1, a schematic plan view shows an automatic single wafer single side polishing machine provided with a loading robot which employs a wafer loading and unloading mechanism according to the present invention.

This automatic single wafer single side polishing machine 1 includes a loading robot 4 having a pair of loading cassettes 2 and 3 on top of one of the side portions on one side thereof, wherein one of the loading cassettes 2 of the loading robot 4 receives a plurality of unpolished wafers in such a way that they do not contact each other, and the other loading cassettes 3 is disposed on the other side of the loading cassette 2 and receives a plurality of polished wafers, also in such a manner that they do not contact each other.

On the other side portion of the loading robot 4, there is provided a grabbing member for taking an unpolished wafer out from one of those loading cassettes 2 in the loading robot 4 and storing a polished wafer into the other loading cassette 3, and on top of the other side portion in the middle adjacent to the grabbing member 5, there is provided a buffer unit 7 having four buffers 6 equally spaced thereon.

On the other side portion, there are provided a pair of surface plate units 8 and 8 adjacent to the buffer unit, and dresser units 9 and 9 adjacent to the pair of surface plate units 8 and 8 respectively.

The dresser arms 10 and 10 mounted on these dressers 9 and 9 are movable respectively in a swinging manner between the position contacting the upper surface of the surface plate 8a of corresponding surface plate unit 8 and 8 and the waiting position being away from above the upper surface thereof.

Two pressure plate units 11 and 11 provided above the buffer unit 7 and a pair of surface plate units 8 and 8 are both horizontally movable above the buffer unit 7 and a pair of surface plate units 8 and 8 by means of drive mechanism 12 and 12 disposed on both sides thereof, and both of these pressure plate units 11 and 11 are freely movable without restricting the movement of each other. The pressure plate units 11 and 11 are respectively provided with two pressure plates 13 and 13 which are movable upward and downward.

The two pressure plates 13 and 13 of each pressure plate unit 11 and 11 are disposed in such a way that the distance between them is the same as that between two buffers 6 located on a diagonal of the buffer unit 7, and that they lie within the diameter of the surface plate 8a of the surface plate units 8 and 8.

Figure 2:
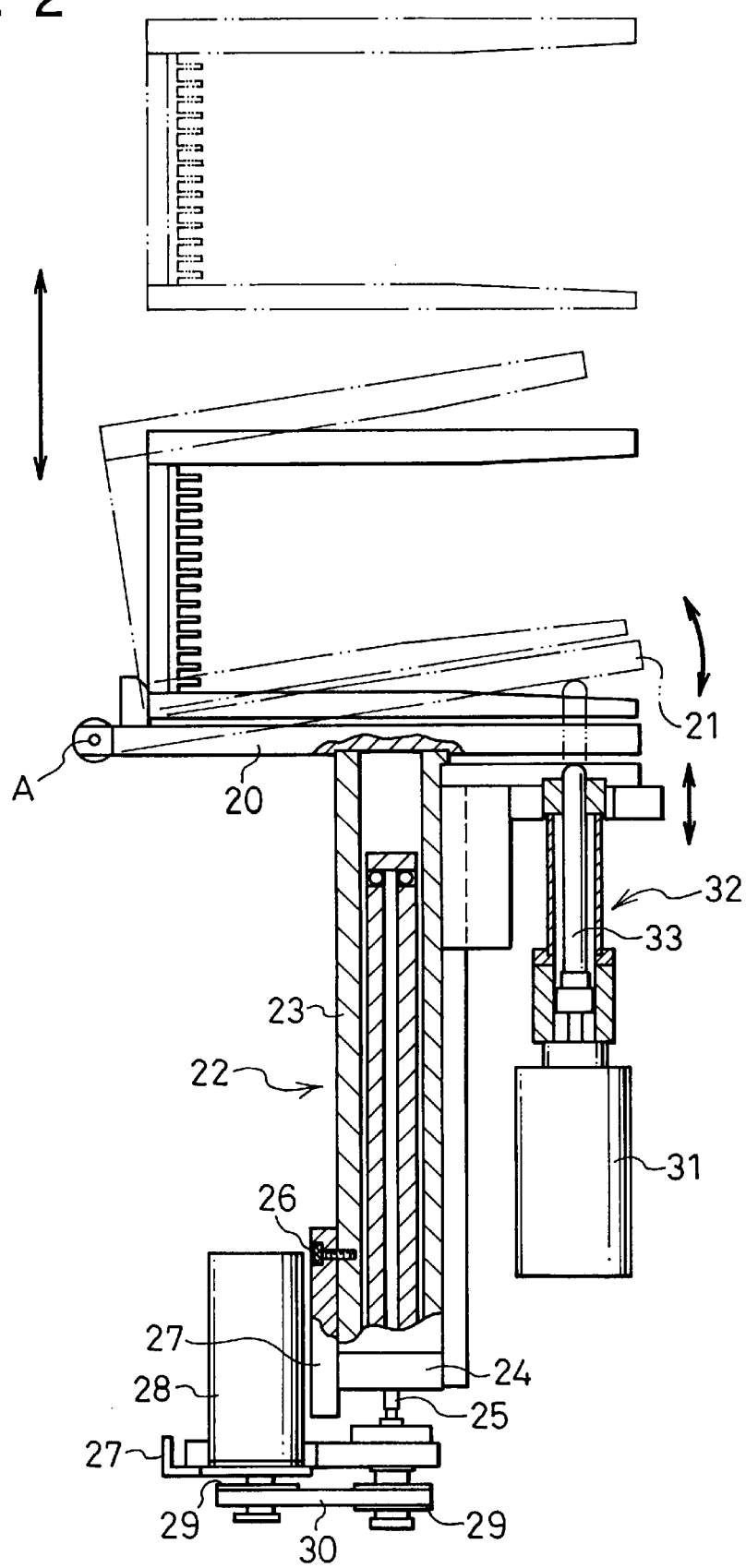
FIG. 2 is a schematic view illustrating a wafer loading and unloading mechanism of a loading robot disposed in the automatic single wafer polishing machine shown in FIG. 1.

In an automatic single-wafer single-side polishing machine constructed as described above, the wafer loading and unloading mechanism for the loading robot is constructed as shown in FIG. 2.

On the lower center of the base 20 on which a swinging base 21 is mounted so as to be movable upward and downward in a swinging manner with the rear end portion as a fulcrum, a ball screw 22 is secured with the ends facing upward and downward.

In other words, the upper end of a cylindrical portion 23 is secured to the base 20 in such a way that it extends downwardly, the lower end of the cylindrical portion 23 is fixed by a nut portion 24, and the screw shaft 25 extends through the nut portion 24 within the inner part of the cylindrical portion 23 and also protrudes from the lower end of the cylindrical portion 23.

The cylindrical portion 23 is also secured on a machine base 27 of the loading robot via a screw 26, while a first operating member having the ends facing upward and downward, that is to say, a rotary drive 28 is also secured on the base plate 27 of the loading robot with its drive shaft protruding from the lower end thereof.

On the lower end of the screw shaft 25 of the ball screw 22 and on the drive shaft of the rotary drive 28, there are provided pulleys 29 and 29 respectively, and between these pulleys 29 and 29, there is provided a belt 30 for transmitting rotary driving force in a tensioned state.

Under the base 20 on the opposite side in a plan view of the pivotal point A where a swinging base 21 is connected with respect to the ball screw 22, there is provided a second operating member 32 whereof an operating portion 33 appears and disappears by means of drive 31.

In the automatic single wafer single side polishing machine constructed as mentioned above, an operator loads and stores a plurality of unpolished wafers in one of the loading cassettes 2 located in the loading robot 4.

A grabbing member 5 then grabs and transports an unpolished wafer onto the buffer 6 of the buffer unit 7, then the unpolished wafer is delivered to the surface plate units 8 and 8 by a pair of pressure plates 13 and 13 of the pressure plate unit 11 and is polished there, then the polished wafer is returned to the buffer unit 7 again and stored in the other loading cassette 3 by means of the grabbing member 5.

In the above-described wafer transporting process, the loading cassette 2 is moved upward or downward successively in steps by means of the first operating member 28 to accept unpolished wafers inserted in each mount in the loading cassette 2 respectively. When the loading cassette moves upward and downward, the second operating member 32 moves therewith unitarily.

Although the base 20, the swinging base 21, and the loading cassette 2 are so constructed as to be moved upward and downward by transmitting rotary driving force of the first operating member 28 to the ball screw 22 via the belt 30, since the belt 30 which transmits rotary driving force of the first operating member 28 is located at a position lower than that of loading cassette 2 for storing wafers, there is no risk that wafers will be contaminated with fine particles or dust generated by the sliding movement of the belt 30 which occurs when the rotary driving force is transmitted.

When the loading and storing of wafers into each mount in the loading cassette 2 is complete, the second operating member 32 is actuated to make the operating portion 33 thereof protrude, the rear side of the swinging base 21 (viewed in the direction of wafer insertion) moves upward since the pivotal point A on the front side thereof (viewed in the direction of wafer insertion) is connected with the base 20, and thus wafers loaded on each mount slide forward and are held in a state so that the front ends thereof are abutting against the innermost wall of the loading cassette 2.

The stored wafers are thus all loaded at the same position in a plan view of the loading cassette 2.

The polished wafers are also loaded in a same manner in the loading cassette 3 and in the same position in a plan view. Therefore, since the belt 30 transmitting rotary driving force is located at a level lower than that of the loading cassette 3, wafers in the loading cassette 3 have no risk of being contaminated with fine particles from the belt 30 or dust made airborne during transmission of driving force.

By disposing the drive transmission mechanism for moving the loading cassettes upward and downward at the level lower than that of the loading cassettes as stated above according to the present invention, even when fine particles are generated by the abrasion of the belt due to the sliding movement, or even when dust becomes airborne during the transmission of driving force, wafers are not subject to contamination with such fine particles or dust, and thus the throughput is improved, the quality of polished wafers will always be satisfactory, and the production cost can be decreased.

What is claimed is:

1. A wafer loading and unloading mechanism mounted on a loading robot which composes an automatic single-wafer single-side polishing machine for moving loading cassettes upward and downward in a swinging manner, comprising:

a base;

a swinging base is movable upward and downward in a swinging manner with respect to said base with as a fulcrum, and being provided with a loading cassette thereon;

a first operating member mounted under said base to which the driving force from a drive is transmitted via a belt, said first operating member moving said base upward and downward when driving force is transmitted;

a second operating member mounted under said base to move said swinging base upward when actuated; wherein said second operating means is actuated after wafers have been inserted into said loading cassette to place each wafer at innermost position of said loading cassette.

* * * * *